United States Patent [19]

O'Dell

[11] Patent Number: 5,740,219

[45] Date of Patent: Apr. 14, 1998

[54] DIGITAL COUNTER TEST CIRCUIT

[75] Inventor: David John O'Dell, Phoenix, Ariz.

[73] Assignee: VLSI Technology, Inc., San Jose, Calif.

[21] Appl. No.: 753,922

[22] Filed: Dec. 3, 1996

[51] Int. Cl.$^6$ ...................................................... H03K 21/40
[52] U.S. Cl. ......................................................... 377/29
[58] Field of Search ........................................... 377/29

[56]  References Cited

FOREIGN PATENT DOCUMENTS

| 0093434 | 7/1981 | Japan | 377/29 |
| 0059632 | 4/1983 | Japan | 377/29 |
| 406140922 | 5/1994 | Japan | 377/29 |

*Primary Examiner*—Margaret Rose Wambach

*Attorney, Agent, or Firm*—LaValle D. Ptak

[57]  ABSTRACT

A system for testing a digital counter of mn stages, in which the counter is organized into m segments, each of n bits, includes a two input exclusive OR gate connected between each of the m segments. One of the two inputs of each exclusive OR gate is obtained from the carry output of a lower order one of the m segments, and the output of each exclusive OR gate is connected to the carry input of the next higher order one of the m segments. The other inputs to the exclusive OR gates are obtained from a test signal enable input, which is driven high (binary "1") for the test mode of operation. The counter is fully exercised in the test mode in a parallel operation, with full testing of the carry bits from one segment to the next, without any interruption in the clock signal input stream.

8 Claims, 2 Drawing Sheets

DIGITAL COUNTER TEST CIRCUIT

BACKGROUND

Digital counters having a large component count currently are used in integrated circuit and other circuit applications. Such counters may be referred to as "high-bit" count counters. Typically, they are used for time out counters or timers in a variety of different applications. Some such applications include the timing of various functions in real time computer operation.

In order to test the accuracy of high-bit digital counters, the counters should be operated through the entire range of counts capable of implementation by such counters. To test a counter having a relatively large number of stages in real time, however, consumes an extremely large amount of tester time. This is particularly true if the counter must be operated in a normal mode, since the counter clock for a normal mode of operation generally is at a lower frequency than the higher frequencies which are available in some test modes of operation. For example, to fully exercise or fully test a sixteen-bit digital counter, it would require 65,000 clock pulses to operate the counter through its entire count on a bit-by-bit basis. Even if these clock pulses are applied at a high frequency test mode of operation, the time for effecting a full test of such a counter in this manner is not practical. At the same time, however, it is desirable to perform 100% testing of such counters before they are incorporated into operating systems.

Efforts have been made to shorten the time required for testing large multi-stage counters by segmenting the counter stages into different groups and then testing the groups in parallel with one another. Parallel testing of the counters within each group significantly reduces the testing time, but fails to test the interface or "carry" connections between the different groups within the counter. Thus, it is possible for errors to exist in the interfaces which are not tested by such a system. Failure to detect such errors may result in the incorporation of a flawed counter into a finished product. This type of testing is called a fixed division scheme, which cannot fully test a counter because the carry bit for each section cannot be tested.

To fully test large bit-count multi-stage counters, systems have been designed to employ two fixed division schemes to ensure testing of the interface or connections between the segments. In such a system, two test modes are employed. The first test mode is used for testing the portion of the interface connections between the segments. After this first portion of the test has been run, a switchover to the second test mode is made to complete the testing of the remainder of the counter and interfaces. While this type of system permits parallel testing of the stages of the counters in different groups of equal numbers of stages, time is wasted in the tester during the switching over from one test mode to the other test mode.

A system which has been designed to accelerate counter testing without the loss of fault coverage is disclosed in the U.S. Pat. No. to Moughanni 5,402,458. This system of this counter divides the counter into a number of different segments, each having an equal number of bits or stages. The system operates to detect when each segment nears the last count, and overrides the test mode to re-enable a between segment clock path between the segments before the last count to permit the last count to ripple through the counter to test connections between the segments on the next clock cycle. While this system theoretically functions to test all of the stages, as well as the interface connections between the different segments of the counter, a test of these connections from one segment to the next is effective only from a cycle of "0" to "1". The system cannot test between segments where the count changes from a "1" to "0" in the interface. As a consequence, while the Moughanni system overcomes many of the disadvantages of the prior art, an incomplete test results from this inherent weakness in the interconnections between the different segments of the counter undergoing a test with the system of Moughanni. The Moughanni system does operate to produce a rapid test of the counter, with a relatively low number of clock cycles, subject to the weakness noted above.

Other systems have been devised for testing digital counters to eliminate a switchover time between the testing of different blocks, as is required with the system of Moughanni. Such systems operate to divide the counter into different segments and then further divide the segments into two groups, with the first group being selected for a pre-established number of clock cycles. The completion of this sequence of the test mode for the first group is detected by gates coupled with the most significant bits of the last one of the segments to switch the system to select the second group for finishing the test cycle.

It is desirable to provide a system and method for testing digital counters which eliminates switchover time between the testing of different blocks or stages within the counter and which fully tests all of the counter segments, including carryovers from previous segments, in a complete, rapid, efficient test.

SUMMARY OF THE INVENTION

In accordance with a preferred embodiment of the invention, a counter of mn bits undergoing test is divided into m segments of n bits each, with a carry output for each of the m segments and a carry input for each of the m segments. A two-input exclusive OR gate is coupled between each of the m segments of the counter. A carry output of a lower order of one of the m segments is connected to the first input of the exclusive OR gate and the output of the exclusive OR gate connected to the carry input of the next higher order one of the m segments. The second input to each of the exclusive OR gates is obtained from a source of test enable signals to permit the exclusive OR gates to respond to the carry output of the m counter segments in a test mode of operation of the counter.

DETAILED DESCRIPTION

Figure 1:
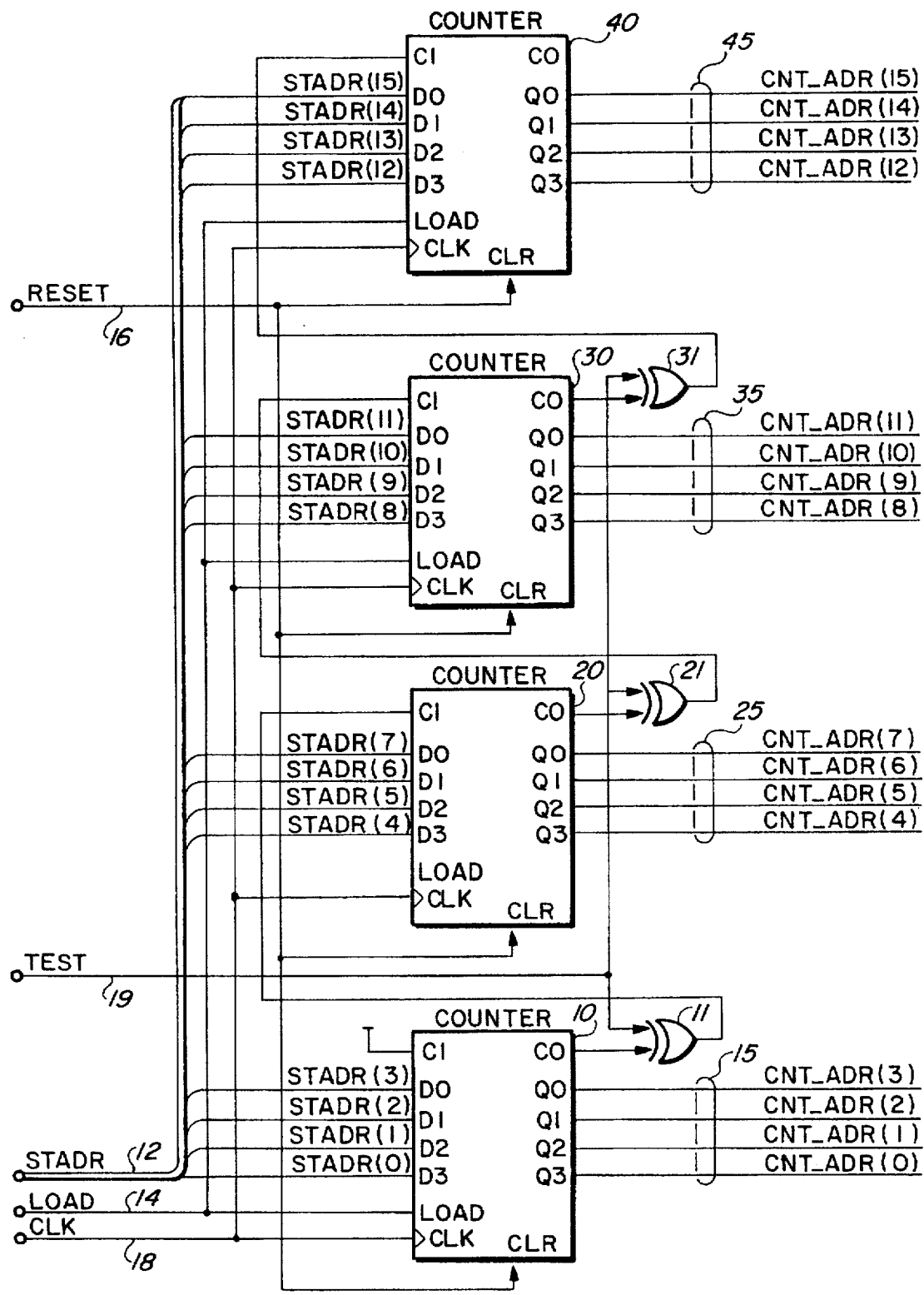
FIG. 1 is a block diagram of a counter configured in accordance with a preferred embodiment of the invention.

Reference now should be made to the drawings, in which the same reference numbers are used throughout the figures to designate the same components. FIG. 1 is a block diagram of a digital counter which is configured to permit parallel testing of different segments of stages of the counter, including full testing of all segments including the carry bit between the segments.

FIG. 1 illustrates a 16 stage loadable counter, which is divided into m segments (four, as shown in FIG. 1) of n bits or stages (also four, as shown in FIG. 1) each. The different segments are shown as segments 10, 20, 30 and 40, with segment 10 handling stages or bits 0 through 3, segment 20 handling bits 4 through 7, segment 30 handling bits 8 through 11, and segment 40 handling bits 12 through 15 for the total 16 stages or bits of the complete counter.

The address signals which are loaded into the various stages of the counter are supplied over a bus 12, which is shown branching off to the four inputs to each of the counter segments 10, 20, 30 and 40. When the address signals are present at these inputs, a load pulse applied over a "load" input lead 14 sets the addresses at each of the stages or bits of the counter into those stages. Prior to any operation, a reset pulse is applied over a reset lead 16 to initially clear the counter. For normal operation of the counter, a clock pulse is applied over a lead 18; and this pulse is shown as supplied to each of the counter segments 10, 20, 30 and 40. In reality, the clock pulse is individually applied to each of the four stages or bits located within each of the segments 10, 20, 30 and 40, as is more apparent from the subsequent description of the detailed circuit shown in FIG. 2.

In order to permit operation of the counter of FIG. 1 in a parallel mode of operation for test purposes, an exclusive OR gate is located between the output carry line of each of the segments 10, 20 and 30 and the carry input to each of the higher or next order segments 30 and 40, respectively. These exclusive OR gates are the gates 11, 21 and 31 shown in FIG. 1. A second input to each of the exclusive OR gates 11, 21 and 31 is provided from a test mode signal input applied over a lead 19; and this input is applied in parallel to each of the gates 11, 21 and 31.

Under normal operation, the signal on the test line 19 is low or "0"; so that the counter comprising the four segments 10, 20, 30 and 40 operates in a normal manner (that is, non-parallel) as a conventional 16 bit or 16 stage counter. The four outputs from each of the four segments are shown as the four output groups 15, 25, 35 and 45 in FIG. 1.

Figure 2:
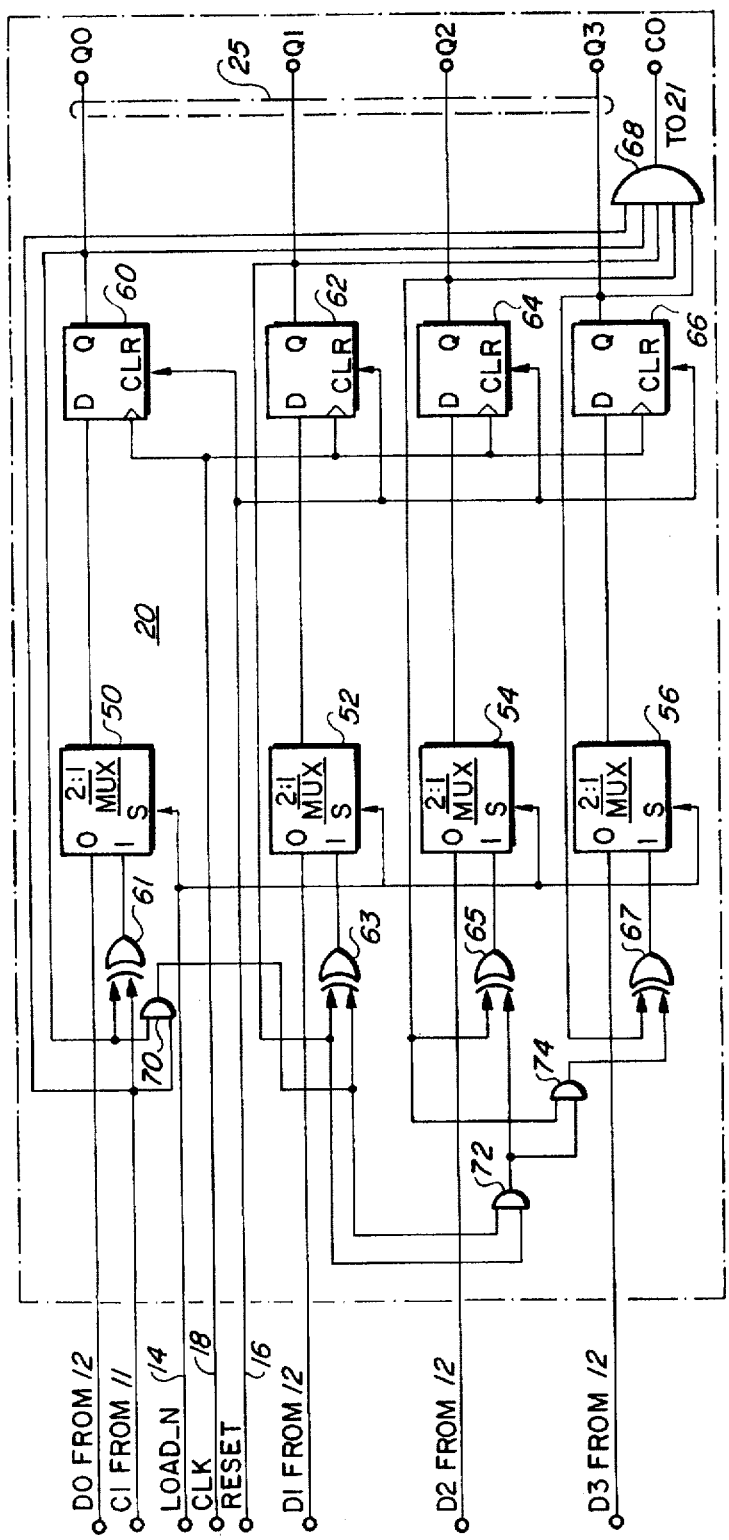
FIG. 2 is a detailed block diagram of a portion of the embodiment shown in FIG. 1.
Figure 3:
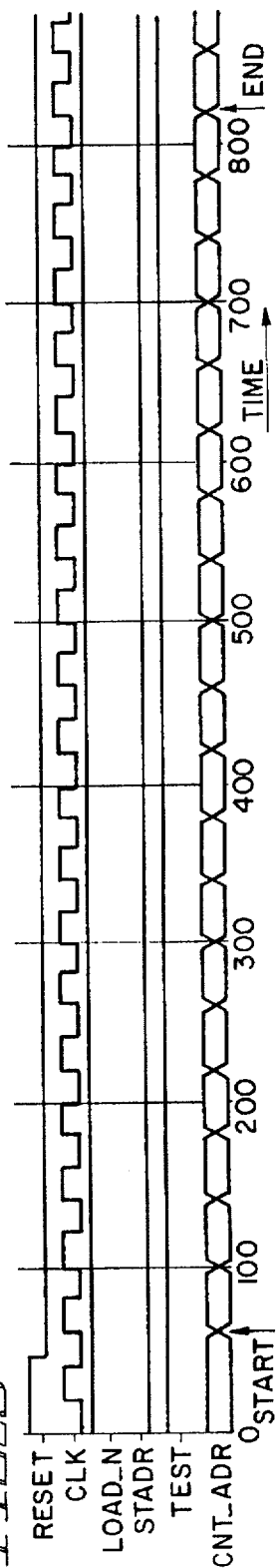
FIG. 3 is a waveform diagram useful in explaining the operation of the system shown in FIGS. 1 and 2.

Reference now should be made to FIGS. 2 and 3. FIG. 2 is a detailed circuit diagram of counter segment 20 shown in FIG. 1. This segment is enclosed within the dot/dash lines; and the various inputs and outputs from the segment extend beyond these lines. On the left-hand side of FIG. 2 are the input signals which are found in the left-hand side of FIG. 1 with the addition of the carry input signal obtained from the output of the exclusive OR gate 11, which is indicated as the signal "CI" (second from the top) in FIG. 2. On the right-hand side of FIG. 2 the carry output signal from the last stage of the counter segment 20, which is supplied to the exclusive OR gate 21, is identified as the "CO" signal. This corresponds to the lower input to the exclusive OR gate 21, as shown in FIG. 1.

The counter segment 20 is representative of the other counter segments 10, 30 and 40 shown in FIG. 1; and all of these segments are the same. The only difference between the segments is that the lower segment 10 has the carry input signal "CI" tied directly to ground; and the segment 40 has no output provided for the carry output signal "CO". In all other respects all four segments 10, 20, 30 and 40 are identical to the detailed diagram of segment 20 shown in FIG. 2.

To effect operation of the circuit in its test mode, the various signal inputs which are shown in FIG. 3 are employed. The reset signal first is applied and then removed, to set or clear the entire counter to its "0" state in all stages. No load signals are provided; and the "load-N" input 14 remains high. No address signals (STADR) are provided; and the signals from the address bus 12 all are low, as shown in FIG. 3. In contrast to the normal run operation of the counter, the test signal input applied over the lead 14 (FIG. 1) is "high" or binary "1" as shown for the "test" input signal in FIG. 3. This is the upper input to each of the exclusive OR gates 11, 21, 31 shown in FIG. 1, to permit the counter to operate in the test mode by parallel exercising of the four segments 10, 20, 30 and 40.

Within the counter segment 20 (one of the four "m" segments 10, 20, 30 and 40) four two-input multiplex gates 50, 52, 54 and 56 are used to supply the input signals to the "D" input of the corresponding "D" flip-flops 60, 62, 64 and 66, respectively. Clock signals from the clock input 18, as shown in the waveform "CLK" in FIG. 3, are applied to the clock inputs of each of the stages 60, 62, 64 and 66.

The outputs from the stages 60, 62, 64 and 66 constitute the output signals Q0, Q1, Q2 and Q3 in the group 25. The internal feedback from the outputs of each of these stages to the inputs of the two-to-one multiplex circuits 50, 52, 54, 56 is applied to the upper one of two inputs of respective exclusive OR gates 61, 63, 65 and 67, the outputs of which are connected to the lower or "1" input of the two-to-one multiplex circuits 50, 51, 52 and 56, respectively. The internal operation of the counter segment 20 also includes four AND gates 68, 70, 72 and 74. The carry input obtained from exclusive OR gate 11 is applied to the other one of the two inputs of the exclusive OR gate 61 and to the second input of the first AND gate 70, the other input of which is obtained from the Q0 output of the D flip-flop 60.

In turn, the output of the AND gate 70 is coupled to the second input of the exclusive OR gate 63 and to one of the two inputs to an AND gate 72, the other input of which is obtained from the "Q1" output from the D flip-flop 62. The output of the AND gate 72 then constitutes a second input for the exclusive OR gate 65, and also is one of the two inputs to an AND gate 74, the output of which is the second input to the exclusive OR gate 67. The input to the "carry" exclusive OR gate 21 is obtained from the AND gate 68 which has inputs from each of the flip-flops 60, 62, 64, 66 and the exclusive OR gate 11.

The internal workings of the segment 20 (representative of all the "m" segments 10, 20, 30 and 40, shown in FIG. 1) is conventional. The circuit, however, when it is operated in the test mode, utilizes the exclusive OR gates 11, 21 and 31 interconnected as shown in FIG. 1 to produce a full exercise of the entire counter in a parallel manner, but including all of the carry bits, with a total of 20 counts to obtain such a full test of the counter. Carry bits of both "0" and "1" are handled with this circuit. As is readily apparent from an examination of FIG. 1, the additional circuitry needed to obtain this thorough full testing of the counter is minimal, essentially the exclusive OR gates 11, 21 and 31 and the test signal input on the input 19. The counter segments 10, 20, 30, 40 all count up at the same time in the test mode, except when there is a carry bit from the previous segment.

As shown in FIG. 2, at the start of operation (after a reset or clear pulse has been applied over the lead 16), full exercise of the counter is effected as illustrated in the bottom waveform of FIG. 3, with twenty clock pulses, as is readily apparent from an examination of FIG. 3. All of the stages of the different segments 10, 20, 30, 40 of the counter are fully tested. In contrast to prior art systems, the system which is shown in FIGS. 1 and 2 fully tests the carry bits between the m segments. This is accomplished without any changes in the status of the test signal applied during the test mode of operation. In addition, the clock signal does not have to be interrupted nor are any other changes made during the test mode of operation.

If OR gates were employed as the carry gates between the m segments, it would require a stopping of the test signal at a full count of the counter and then continuing with the clock. This is difficult to accomplish with current high-speed clock signals. The system which is shown in FIGS. 1 and 2 permits the full count, including all carry terms, to be accomplished in the test mode running constantly, without any interruption or change.

When the test signal on the input 19 reverts to a low or "0" signal during normal operation of the counter subsequent to testing, the exclusive OR gates 11, 21 and 31 essentially are transparent and permit normal operation of the counter to take place, in the same manner as if a direct connection were made from the "CO" output of a lower order segment to the "CI" input of the next higher order segment. The counter then operates in a sequential or serial mode instead of the parallel mode, which is utilized during the test operation.

The foregoing description of the preferred embodiment of the invention should be considered as illustrative and not as limiting. Various changes and modifications will occur to those skilled in the art for performing substantially the same function, in substantially the same way, to achieve substantially the same result without departing from the true scope of the invention as defined in the appended claims.

What is claimed is:

1. A system for testing a counter of mn stages in which the counter is organized into m segments, each of n bits, with a carry output for each of said m segments and a carry input for each of said m segments, said system including in combination:

a source of clock pulses applied to said counter for advancing the count therein;

an exclusive OR gate having an output and first and second inputs coupled between each of said m segments of said counter, with the carry output of a lower order one of said m segments connected to the first input of said exclusive OR gate and the output of said exclusive OR gate connected to the carry input of the next higher order one of said m segments; and a source of test enable signals connected to the second inputs of each of said exclusive OR gates for enabling said exclusive OR gates to respond to the carry output of said m counter segments in a test mode of operation of said counter.

2. The combination according to claim 1 wherein said m segments of said counter are tested in parallel with one another when said test enable signals are supplied to said second inputs of each of said exclusive OR gates.

3. The combination according to claim 2 wherein each of the m segments has n bits, and the carry output of each lower order one of said m segments is obtained from the output of the n bits of said segment and the carry input of each of said higher order one of said m segments is applied to the input of the stage for the lowest order bit of said segment.

4. The combination according to claim 1 wherein each of the m segments has n bits, and the carry output of each lower order one of said m segments is obtained from the outputs of the n bits of said segment and the carry input of each of said higher order one of said m segments is applied to the input of the stage for the lowest order bit of said segment.

5. A method for testing a counter of mn stages in which the counter is organized into m segments, each of n bits, with a carry output for each of said m segments and a carry input for each of said m segments, including the steps of:

organizing a digital counter into m segments;

providing a source of clock pulses for operating said counter to advance the count in each of said m segments;

interconnecting the carry stage of each of said m segments with the lowest order stage of the next higher order one of said m segments through an exclusive OR gate; and enabling said exclusive OR gate with a test signal for automatically testing all of said m segments of said counter in parallel with carry bits from each segment to the next higher order segment being effected through said enabled exclusive OR gates.

6. The method according to claim 5 wherein said exclusive OR gates are two-input exclusive OR gates and the step of applying an enable signal comprises the step of applying a high binary "1" signal to each of said exclusive OR gates.

7. The method according to claim 6 further including the step of clearing all of said mn stages of said counter prior to the application of clock pulses thereto for advancing the count therein.

8. The method according to claim 5 further including the step of clearing all of said mn stages of said counter prior to the application of clock pulses thereto for advancing the count therein.

* * * * *